United States Patent
Tietz et al.

[19]

[11] Patent Number: 6,157,106
[45] Date of Patent: Dec. 5, 2000

[54] MAGNETICALLY-LEVITATED ROTOR SYSTEM FOR AN RTP CHAMBER

[75] Inventors: James V. Tietz, Fremont; Benjamin Bierman, Milpitas, both of Calif.

[73] Assignee: Applied Materials, Inc., Santa Clara, Calif.

[21] Appl. No.: 08/879,497

[22] Filed: May 16, 1997

[51] Int. Cl.$^7$ .................................................. H02K 7/09
[52] U.S. Cl. ........................ 310/90.5; 310/86; 118/730
[58] Field of Search ........................ 310/86, 90.5, 261; 118/730, 715, 725

[56] References Cited

U.S. PATENT DOCUMENTS

| | | | |
|---|---|---|---|
| 5,155,336 | 10/1992 | Gronet et al. | 219/411 |
| 5,527,393 | 6/1996 | Sato et al. | 118/725 |
| 5,660,472 | 8/1997 | Peuse et al. | 374/128 |
| 5,755,511 | 5/1998 | Peuse et al. | 374/128 |
| 5,884,412 | 3/1999 | Tietz et al. | 34/58 |
| 5,960,555 | 10/1999 | Deaton et al. | 34/58 |
| 6,035,100 | 3/2000 | Bierman et al. | 392/416 |
| 6,048,403 | 4/2000 | Deaton et al. | 118/725 |

FOREIGN PATENT DOCUMENTS

| | | |
|---|---|---|
| 97/03225 | 1/1997 | WIPO . |
| 97/15978 | 5/1997 | WIPO ................................. 310/90.5 |

*Primary Examiner*—Elvin Enad
*Assistant Examiner*—Karl E. Tamai
*Attorney, Agent, or Firm*—Fish & Richardson

[57] ABSTRACT

Accomodations for a magnetically levitated rotating system in an RTP chamber are provided. The system includes a magnetically permeable rotor; a cylindrical thin wall concentric with and surrounding the rotor; and a magnetic stator assembly adjacent the cylindrical thin wall. The radial distance between the rotor and the magnetic stator assembly is small enough that a magnetic field created by the stator assembly magnetically levitates the rotor but is great enough that the rotor does not physically contact the thin wall upon thermal expansion. The system is such that the relative positions of a plurality of sensors which determine the position of a rotating frame is maintained upon dismantling. Thermal isolation of the area including the rotor is accomplished from the reactive gases in a processing area of the RTP chamber. The rotor may be cooled by a number of cooling chambers formed within the chamber.

11 Claims, 10 Drawing Sheets

MAGNETICALLY-LEVITATED ROTOR SYSTEM FOR AN RTP CHAMBER

FIELD OF THE INVENTION

The present invention relates to rapid thermal processing (RTP) chambers, and more particularly, to features of an RTP chamber employing a magnetically-levitated rotor system.

BACKGROUND OF THE INVENTION

RTP system technologies have been developed to increase manufacturing throughput of wafers while minimizing their handling. The types of wafers referred to here include those for ultra-large scale integrated (ULSI) circuits. RTP refers to several different processes, including rapid thermal annealing (RTA), rapid thermal cleaning (RTC), rapid thermal chemical vapor deposition (RTCVD), rapid thermal oxidation (RTO), and rapid thermal nitridation (RTN).

The uniformity of the process over the surface of the substrate during thermal processing is also critical to producing uniform devices. For example, in the particular application of complementary metal-oxide-semiconductor (CMOS) gate dielectric formation by RTO or RTN, thickness, growth temperature, and uniformity of the gate dielectrics are critical parameters that influence the overall device performance and fabrication yield. Currently, CMOS devices are being made with dielectric layers that are only 60–80 Å ($10^{-10}$m) thick and for which thickness uniformity must be held within a few percent. This level of uniformity requires that temperature variations across the substrate during high temperature processing cannot exceed a few degrees Celsius (° C.). Therefore, techniques that minimize temperature non-uniformity are very important.

In one RTP process, wafers are loaded into a processing chamber at a temperature of several hundred ° C. in a nitrogen ($N_2$) gas ambient atmosphere. The temperature of the wafer is ramped to reaction conditions, typically at a temperature in the range of about 850° C. to 1200° C. The temperature is raised using a large number of heat sources, such as tungsten halogen lamps, which radiatively heat the wafer. Reactive gases may be introduced before, during, or after the temperature ramp. For example, oxygen may be introduced for growth of silicon dioxide ($SiO_2$).

As mentioned, it is desirable to obtain temperature uniformity in the substrate during processing. Temperature uniformity provides uniform process variables over the substrate (e.g., layer thickness, resistivity, and etch depth) for various process steps including film deposition, oxide growth and etching.

In addition, temperature uniformity in the substrate is necessary to prevent thermal stress-induced wafer damage such as warpage, defect generation and slip. This type of damage is caused by thermal gradients which are minimized by temperature uniformity. The wafer often cannot tolerate even small temperature differentials during high temperature processing. For example, if the temperature differential is allowed to rise above 1–2° C./centimeter (cm) at 1200° C., the resulting stress is likely to cause slip in the silicon crystal. The resulting slip planes will destroy any devices through which they pass. To achieve that level of temperature uniformity, reliable real-time, multi-point temperature measurements for closed-loop temperature control are necessary.

One way of achieving temperature uniformity is by rotating the substrate during processing. This removes the temperature dependence along the azimuthal degree-of-freedom. This dependence is removed since, as the axis of the substrate is collinear with the axis of rotation, all points along any annulus of the wafer (at any arbitrary radius) are exposed to the same amount of illumination. By providing a number of pyrometers and a feedback system, even the remaining radial temperature dependence can be removed, and good temperature uniformity achieved and maintained across the entire substrate.

Figure 1:
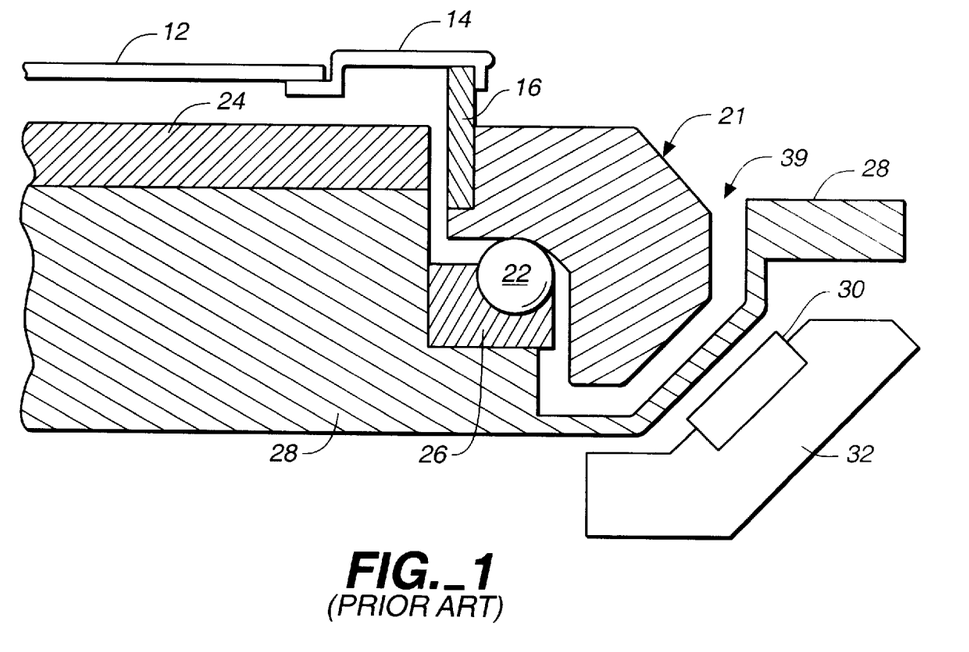
FIG. 1 is a cross-sectional view of a prior art bearing and rotation system used in an RTP chamber.

One example of a type of mechanical rotation system in use today is shown in FIG. 1. This type of system is similar to those used and sold today by Applied Materials, Inc., of Santa Clara, Calif. Certain details of such systems are provided in U.S. Pat. No. 5,155,336, entitled "Rapid Thermal Heating Apparatus and Method", issued Oct. 13, 1992, assigned to the assignee of the present invention, and incorporated herein by reference. In this type of mechanical rotation system, the substrate support is rotatably mounted on a bearing assembly that is, in turn, coupled to a vacuum-sealed drive assembly. For example, FIG. 1 depicts such a system. A wafer 12 is placed on an edge ring 14, which is in turn friction-fit on a cylinder 16. Cylinder 16 sits on a ledge of an upper bearing race 21 which is magnetic. Upper bearing race 21 is disposed within well 39 and revolves, by virtue of a number of ball bearings 22 (only one of which is shown), relative to a lower bearing race 26. Lower bearing race 26 is mounted generally at a chamber bottom 28. A water-cooled reflector 24 is positioned on chamber bottom 28 as part of the temperature measuring system (details of which are not shown). Magnet 30 is located adjacent the portion of chamber bottom 28 opposite upper magnetic bearing race 21. The magnet is mounted on a motor-driven magnet ring 32.

Magnet 30 is magnetically coupled to magnetic bearing race 21 through chamber bottom 28. By mechanically revolving magnet 30 about the central axis of chamber bottom 28, upper bearing race 21 may be made to rotate as it is magnetically coupled to magnet 30. In particular, torque is transferred to upper bearing race 21 from motor-driven magnet ring 32. The rotation of upper magnetic bearing race 21 results in the desired rotation of wafer 12 through cylinder 16 and edge ring 14.

While fully capable of accomplishing the intended function, the above system has some disadvantages. For example, it is commonly seen that the sliding and rolling contact associated with ball bearings leads to particle generation in the processing chamber. This particle generation arises from the contact between the ball bearings and the races as well as from the necessary use of lubrication for the bearing system.

As another example, the bearing and race system requires a complicated bearing structure with many low-tolerance interconnections. These interconnections result in a large amount of surface area available for the adsorption of undesirable gases and vapors.

Another disadvantage occurs when resort is made to complicated rotational mechanisms. When the objectives of smoother and faster rotations are met using complicated rotational mechanisms, the complicated mechanisms are often damaged by the reactive process gases in other portions of the chamber. This is because these mechanisms are often particularly delicate, e.g., with many low-tolerance interconnections, and are unable to withstand the corrosion and other damage caused by hot process gases.

A related disadvantage occurs when gaseous products of the chemical reactions on the wafer are not fully exhausted via a pumping system. Some amount of these gases may escape the pumping system and undesirably flow to regions below the plane of the wafer. For example, a typical silicon deposition may occur by the reaction of trichlorosilane (TCS) and molecular hydrogen ($H_2$) in a processing region above the wafer. These reactive gases may deleteriously affect certain portions of the processing chamber.

Regions which may be so affected include the region forming the well containing the bearing/race system. Many of the sensitive components relating to rotation may be located in this well. In particular, damage and corrosion may be caused to the bearings and the exterior of the cylinder by the presence of hot gases in these regions.

Another problem associated with present rotation systems is the occurrence of eccentricities in the rotation. For example, as in FIG. 1, it is usual to have a rotationally-driven assembly such as race 21 support an intermediate cylinder 16 which in turn supports a wafer 12 via edge ring 14. In present systems, if intermediate cylinder 16 is not adequately secured to driven assembly 21, intermediate cylinder 16 may spin in an eccentric manner, particularly if its connection to rotationally-driven assembly 21 is non-circularly symmetric. In other words, if intermediate cylinder 16 is held in a non-circularly-symmetric frame, it tends to have an eccentric rotation, especially at high rotational speeds.

Another disadvantage concerns cleaning and repair. Complicated bearing and race rotation systems are difficult to dismantle and clean. For example, it is difficult to dismantle and individually clean numerous ball bearings in such a system.

Therefore, it would be usefull to provide a magnetic levitation drive that is easy to repair, has a relatively uncomplicated structure which is easy to dissemble, and which provides high speed, stable, and smooth rotations.

SUMMARY OF THE INVENTION

In one embodiment, the invention is directed to a magnetically levitated rotating system. The system includes a magnetically permeable rotor; a cylindrical thin wall concentric with and surrounding the rotor; and a magnetic stator assembly adjacent the cylindrical thin wall. The radial distance between the rotor and the magnetic stator assembly is small enough that a magnetic field created by the stator assembly magnetically levitates the rotor but is great enough that the rotor does not physically contact the thin wall upon thermal expansion.

Implementations of the invention may include one or more of the following. The radial distance between the rotor and the cylindrical thin wall may be between about 0.04 and 0.06 inches. The thickness of the cylindrical thin wall may be between about 50 and 150 mils. The cylindrical thin wall may be a wall of a semiconductor processing chamber.

In another embodiment, the invention is directed to an apparatus to maintain the relative positions of a plurality of sensors which determine the position of a rotating frame in a processing chamber. The apparatus includes a central assembly removably mounted to a base of the processing chamber. An assembly abutment is mounted to the central assembly. A plurality of sensors determines the vertical and horizontal positions of the rotating frame relative to the central assembly. A cavity abutment is formed on a wall of the processing chamber, wherein the cavity abutment and the assembly abutment are structured and arranged such that the cavity abutment is removably mounted to the assembly abutment. The plurality of sensors are mounted to the central assembly such that the rotating frame and the central assembly can be removed from the processing chamber without altering the relative positions of the sensors.

In another embodiment, the invention is directed to an apparatus to maintain the relative positions of a plurality of sensors which determine the position of a rotating frame in a processing chamber. The apparatus comprises a central assembly removably mounted to a base of the processing chamber; means for removably mounting the central assembly to the base; and a plurality of sensors mounted to the central assembly to sense the vertical and horizontal positions of the rotating frame relative to the central assembly. The sensors are structured and arranged such that the rotating frame and the central assembly can be removed from the processing chamber without altering the relative positions of the sensors.

Implementations of the invention may include one or more of the following. The removably mounting means may be a plurality of bolts or at least one clamp.

In another embodiment, the invention is directed to an apparatus to substantially thermally isolate a rotating frame from a processing area in a substrate processing chamber. The apparatus comprises a support cylinder rotatably coupled to the rotating frame, the support cylinder having a low thermal conductivity and being sufficiently long such that heat from the processing area is substantially attenuated near the rotating frame. The apparatus also comprises an edge ring coupled to an end of the support cylinder opposite that coupled to the rotating frame, the edge ring structured and arranged to support a substrate.

Implementations of the invention may include one or more of the following. The support cylinder may be made of quartz. The support cylinder may have a length of between about 2.2 and 2.9 inches. A silicon coating may be placed on the support cylinder to provide the support cylinder with a high opacity, such that light from the processing area is substantially attenuated near the rotating frame. The support cylinder may be opaque in a wavelength range of between about 0.8 and 1.1 microns. The thermal conductivity of the support cylinder may be between about 1.5 and 2.5 J-kg-m/$m^2$-sec-° C. The support cylinder may have a wall thickness of between about 50 and 150 mils. A flange may be mounted circumferentially around the support cylinder to further attenuate heat near the rotating frame. A central assembly may be mounted on a base of the processing chamber, the central assembly disposed partially within an area defined by the rotating frame and the support cylinder, such that light from the processing area is substantially attenuated in a space defined by the central assembly and the rotating frame.

In another embodiment, the invention is directed to a rotating system for a processing chamber. The system comprises a rotor having a top surface on which are defined a plurality of holes; a plurality of flexible locator pins mounted in the plurality of holes; and a support cylinder concentric with the rotor and mounted to the rotor by engagement with the locator pins.

Implementations of the invention may include one or more of the following. The locator pins may be friction-fit mounted in a non-threaded manner in the plurality of holes. The holes may be arranged in a circle having a radius greater than the radius of the support cylinder. The the locator pins may include a plurality of locator pin plugs, the locator pin plugs being friction-fit mounted in the plurality of holes.

In another embodiment, the invention is directed to a rotating system for a processing chamber. The system includes a rotatably-mounted rotor having a top surface on which are defined a plurality of holes; a plurality of locator pins including a plurality of locator pin plugs, the locator pin plugs friction-fit mounted in the plurality of holes; and a support cylinder concentric with the rotor, the support cylinder having a groove and the support cylinder friction-fit mounted to the rotor by engagement of the locator pins with the groove.

In another embodiment, the invention is directed to a rotating system in a processing chamber. The system comprises a rotor surrounding a central assembly in proximity thereto; means for levitating the rotor; and cooling chambers formed within the central assembly, the cooling chambers adapted to include a cooling fluid. The proximity of the cooling chambers to the rotor is sufficiently close that the cooling fluid cools the rotor.

Implementations of the invention include one or more of the following. The cooling fluid may be a liquid or a gas. The system may further comprise a source of gas for supplying a gas to a region between the rotor and the central assembly, thereby to cool the rotor through heat conduction. The levitating means may be a magnetic levitation system.

In yet a further embodiment, the invention is directed to a rotating system in a processing chamber. The system comprises a magnetically permeable rotor surrounding a central assembly in proximity thereto. A magnetic stator assembly surrounds the rotor, such that the radial distance between the rotor and the magnetic stator assembly is small enough that a magnetic field created by the stator assembly magnetically levitates the rotor means for levitating the rotor. Cooling chambers are formed within the central assembly, the cooling chambers adapted to include a cooling liquid or gas, such that the proximity of the cooling chambers to the rotor is sufficiently close that the cooling liquid or gas cools the rotor.

In another embodiment, the invention is directed to a sensor system for a processing chamber having a levitated rotor surrounding a central assembly. The system includes a plurality of sensors threadingly mounted in the central assembly to measure the vertical and horizontal position of the rotor; and a cover disposed between the sensors and the rotor wherein the cover is a polymer having a thickness of between about 10 and 30 mils.

Implementations of the invention include one or more of the following. The cover may serve as a touchdown pad for the rotor. The system may further comprise a plurality of adjustors, wherein the sensors are threadingly mounted in a respective one of the adjustors, the adjustors being mounted in the central assembly. The system may further comprise a plurality of sensor mounts, wherein the adjustors are threadingly mounted in a respective one of the sensor mounts by adjustor threads, the sensor mounts being mounted in the central assembly by sensor mount threads. One of the adjustor threads and the sensor threads may be of fine pitch and the other may be of coarse pitch.

It is an advantage of the present invention that substantial isolation of the rotor may be achieved, both thermally and mechanically, from the reactive gases in the processing region of an RTP chamber. Stable, smooth, and high-speed rotations of the rotor in an RTP chamber are likewise achieved. The present invention also allows for very easy dismantling, repair and cleaning.

Other advantages and features of the present invention will become apparent from the following description, including the drawings and claims.

DETAILED DESCRIPTION

One type of RTP apparatus is disclosed in U.S. Pat. No. 5,660,472 entitled "Method and Apparatus for Measuring Substrate Temperatures" to Peuse et al., and U.S. Pat. No. 5,755,611, entitled "Method and Apparatus for Measuring Substrate Temperatures" to Peuse et al., both of which are assigned to the assignee of the present invention and incorporated herein by reference.

The present invention relates to features and adaptations for an RTP chamber which are required for use with a magnetically-levitated substrate rotation drive. The drive includes three main components incorporated into the chamber design: the stator, the rotor assembly, and the sensors. A remote electronics package is also included. The rotor is rotatable mounted, suspended and rotated within a sealed chamber by a commutating magnetic field produced by the stator. Sensors measure the vertical and horizontal position of the rotor as well as the rotational speed of the rotor.

Figure 2:
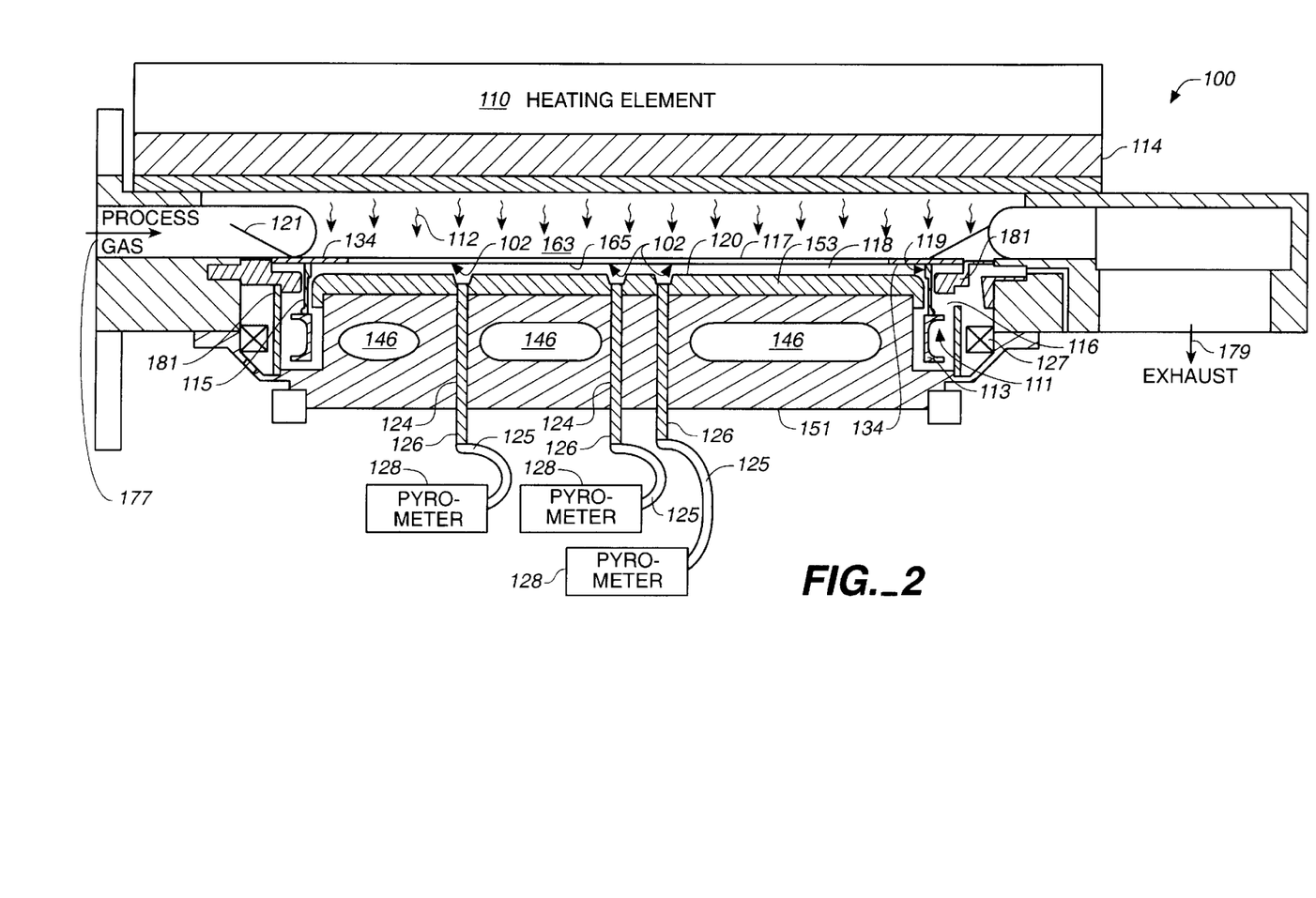
FIG. 2 is a cross-sectional view of an RTP chamber according to the present invention having a magnetically-levitated rotor system.

In particular, FIG. 2 shows an RTP processing chamber 100 for processing a disk-shaped, twelve-inch (300 millimeter (mm)) diameter silicon (Si) substrate 117. The substrate 117 is mounted inside chamber 100 on a rotor system 111 and is heated by a heating element 110 located directly above substrate 117.

As discussed in more detail below, substrate 117 is shown disposed on an edge ring 119 which is mounted on support cylinder 115. Support cylinder 115 is disposed on rotor 113. A co-rotating edge ring extension 121 also extends from edge ring 119. Edge ring 119, support cylinder 115, co-rotating edge ring extension 121, and rotor 113 are the primary components of rotor system 111.

Heating element 110 generates radiation 112 which may enter processing chamber 100 through a water-cooled quartz window assembly 114. The window assembly may be located approximately 25 mm above the substrate. Beneath substrate 117 is a reflector 153 which is mounted on a central assembly 151 having a generally cylindrical base. Reflector 153 may be made of aluminum and has a highly reflective surface coating 120. A reflector cover 155 (shown in FIGS. 6–7 and 10) may be used to protect the reflector. Certain details of such a reflector cover are disclosed in U.S. Pat. No. 6,035,100, assigned to the assignee of the present invention and incorporated herein by reference. An underside 165 of substrate 117 and the top of reflector 153 form a reflecting cavity 118 for enhancing the effective emissivity of the substrate.

The separation between substrate 117 and reflector 153 is variable. In processing systems that are designed for twelve-inch silicon wafers, the distance between substrate 117 and reflector 153 may be between about 3 mm and 20 mm, and preferably between about 5 mm and 8 mm. The width-to-height ratio of cavity 118 should be larger than about 20:1.

The temperatures at localized regions 102 of substrate 117 are measured by a plurality of temperature probes (only three of which are shown in FIG. 2). Each temperature probe includes a sapphire light pipe 126 that is inserted into a conduit 124 that passes from the backside of central assembly 151 through the top of reflector 153. Sapphire light pipes 126 may be about 0.080 inch in diameter and conduits 124 are slightly larger to enable the light pipes to be easily inserted into the conduits. Light pipes 126 are connected to pyrometers 128 via fiber optics 125 which produce a signal indicative of the measured temperature. One way of accomplishing this temperature measurement is disclosed in the patent applications incorporated by reference above entitled "Method and Apparatus for Measuring Substrate Temperatures".

A processing region 163 is located generally above substrate 117. In processing region 163, and to a certain extent in other areas of the chamber, process gases are used in conjunction with the temperature control of substrate 117 via lamps 110 to conduct chemical reactions on substrate 117. These reactions include, but are not limited to, oxidation, nitridation, film growth, etc. The process gases typically emerge into processing region 163 through a gas plenum or showerhead located above or to the side of processing region 163. In FIG. 2, these gases enter from a gas inlet 177. If necessary, process gases may be pumped out of the chamber or exhausted by a pumping system 179 of known design.

Substrate 117 is generally a large diameter silicon wafer. Wafers of other materials may also be used. As noted above, the embodiment discussed here is for a 300 mm wafer, but the invention contemplates a rotational drive for any size wafers, including 200 mm, 450 mm, as well as for wafers of lesser or greater sizes.

Central assembly 151 includes a circulation circuit including chambers 146 fed by coolant inlets 185 (see FIG. 7) through which a coolant such as a cooled gas or liquid circulates, thereby cooling reflector 153. Water which is typically at about 23° C. may be circulated through central assembly 151 to keep the temperature of reflector 153 well below that of heated substrate 117 (e.g., 150° C. or less).

Figure 3:
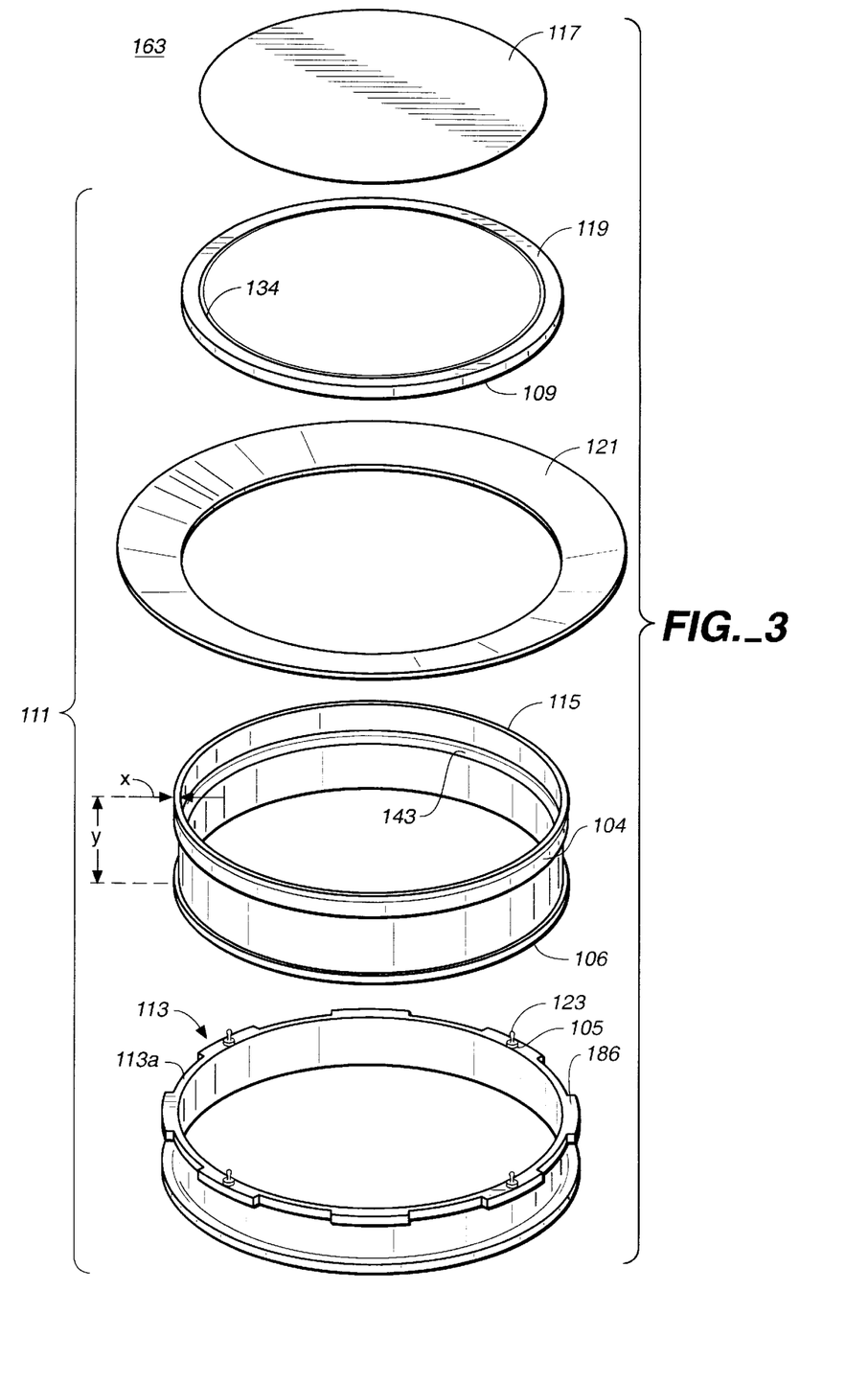
FIG. 3 is an exploded perspective view of a portion of the rotor system according to the present invention showing in particular certain components of the rotor system.

FIG. 3 shows a more detailed perspective view of rotor system 111 according to an embodiment of the present invention. In particular, an exploded perspective view of a rotating frame such as a magnetically-levitated rotor system 111 is shown. Rotor system 111, in use, is located partially in a rotor well 116 (shown in FIGS. 6, 7 and 10). Rotor system 111 supports substrate 117 by means of an edge ring 119 and rotates substrate 117 under heating lamps 110 (shown in FIG. 2) to provide temperature uniformity.

On the inside region of edge ring 119 is a shelf 134 for supporting substrate 117. Shelf 134 is a region around the inside circumference of edge ring 119 that is lower than the rest of edge ring 119. On this shelf, edge ring 119 contacts the substrate around the substrate's outer perimeter, thereby leaving all of an underside 165 of substrate 117 exposed except for a small annular region about the outer perimeter. Edge ring 119 may have a radial width of approximately 0.75 of an inch for a 300 mm substrate. To minimize the thermal discontinuities that may occur at the edge of substrate 117 during processing, edge ring 119 is made of the same, or a similar, material as the substrate, e.g., Si or silicon carbide (SiC).

Edge ring 119, located partially adjacent substrate 117, is subject to corrosion due to its proximity to processing region 163 where reactive gases deposit material on substrate 117. Edge ring 119 is resistant to such corrosion.

Edge ring 119 is designed to create a light-tight seal with a support cylinder 115. Extending from the bottom surface of edge ring 119 is a cylindrically-shaped lip or skirt 109 which has an inside diameter that is slightly larger than the outside diameter of support cylinder 115, so that it fits over support cylinder 115 and forms a light-tight seal. Of course, skirt 109 may connect to support cylinder 115 in a number of other ways as well.

As edge ring 119 has an outer radius that is larger than the radius of support cylinder 115, it extends radially beyond support cylinder 115. This annular extension of edge ring 119 beyond support cylinder 115 functions as a baffle which partially prevents stray light from entering reflecting cavity 118. To further reduce the possibility of stray light entering reflecting cavity 118, edge ring 119 may be coated with a material that absorbs the radiation generated by heating element 110 (e.g., silicon). The absorption should be chosen to occur at least in the wavelength range of the pyrometers, e.g., 0.8 to about 1.1 microns. To further reduce the amount of stray light entering cavity 118, a co-rotating edge ring extension 121 may be used as is described below.

Support cylinder 115 may be made, for example, of quartz and may be coated with Si to render it opaque in the frequency range of pyrometers 128, particularly in the range of about 0.8 to about 1.1 microns. The Si coating on support cylinder 115 acts as a baffle to block out radiation from external sources that might contaminate the pyrometer temperature measurement. Preferred features of support cylinder 115 include the following. It should be made of a material having a low thermal conductivity. One range of values of conductivity that has been found appropriate is about 1.5 to about 2.5 (J-kg-m)/(m$^2$-sec-° C.). Another requirement is that support cylinder 115 should be made of a material that is thermally stable and inert to the types of chemicals used in processing. For example, it may be useful to have support cylinder 115 made of materials that are resistant to chlorine compounds. Another requirement is that the wall of support cylinder 115 should be thin. For example, the dimension "x" of support cylinder 115 may be between about 50 and 150 mils, and more particularly about 100 mils. Such a thickness allows support cylinder 115 to have a relatively low weight, thus lowering its rotational inertia, and an appropriate thermal conductivity. Support cylinder 115 may be supported by a rotor 113. In addition, support cylinder 115 is thus made long (dimension "y") so as to attenuate the amount of heat and light reaching the rotational components, including rotor 113, from processing region 163. That is, support cylinder 115 is made long so that heat and light must traverse a long distance to reach the area of the rotational components. A suitable range of values for y may be from about 2.2 inches to about 2.9 inches.

Rotor 113 is the component upon which the magnetic force acts to levitate rotor system 111. In particular, a magnetic field is generated by a stator assembly 127 (see FIG. 2 and 4A) having permanent magnets (for lift) and electromagnets (for control). Together they act to levitate rotor system 111 as described in more detail below. Alternatively, the permanent magnets may be located within central assembly 151. Such a magnetically-levitated system achieves more stable and smooth rotations as well as higher rotational speeds. U.S. Pat. No. 08/548,692, entitled "Integrated Magnetic Levitation and Rotation System", to Stephen Nichols, et al., assigned to Satcon, Inc., which is incorporated herein by reference.

Rotor 113 may have a cross-sectional shape of a "C" and may be made of a magnetically permeable material such as cold-rolled steel, e.g., 17-4 PHSS or any 400-series stainless steel. It is not necessary that the material be a permanent magnet. Rotor 113 may be advantageously non-chambered and stiff to withstand distortions at high rotational speeds. Rotor 113 may be circular; its top surface may have a circular periphery.

A coating may also be applied to the surface of rotor 113, for example, a tantalum (Ta) coating. This type of coating provides a degree of corrosion protection for rotor 113. A typical Ta coating may be, for example, 0.015 inches thick, and can be applied by a plasma spray-coating process.

Still referring to FIG. 3, support cylinder 115 has a first flange 104, a second flange 143 and a third flange 106. While not strictly required, first flange 104 and second flange 143 may be advantageously offset in the vertical direction so that support cylinder 115 maintains a narrow local cross-section. While each flange is described in more detail below, it is here noted that first flange 104 supports co-rotating edge ring extension 121; second flange 143 extends towards a reflector sidewall 122 (shown, e.g., in FIGS. 7 and 10) to permit a minimum clearance between the two; and third flange 106 is used to frictionally-mount support cylinder 115 to rotor 113.

Figure 4A:
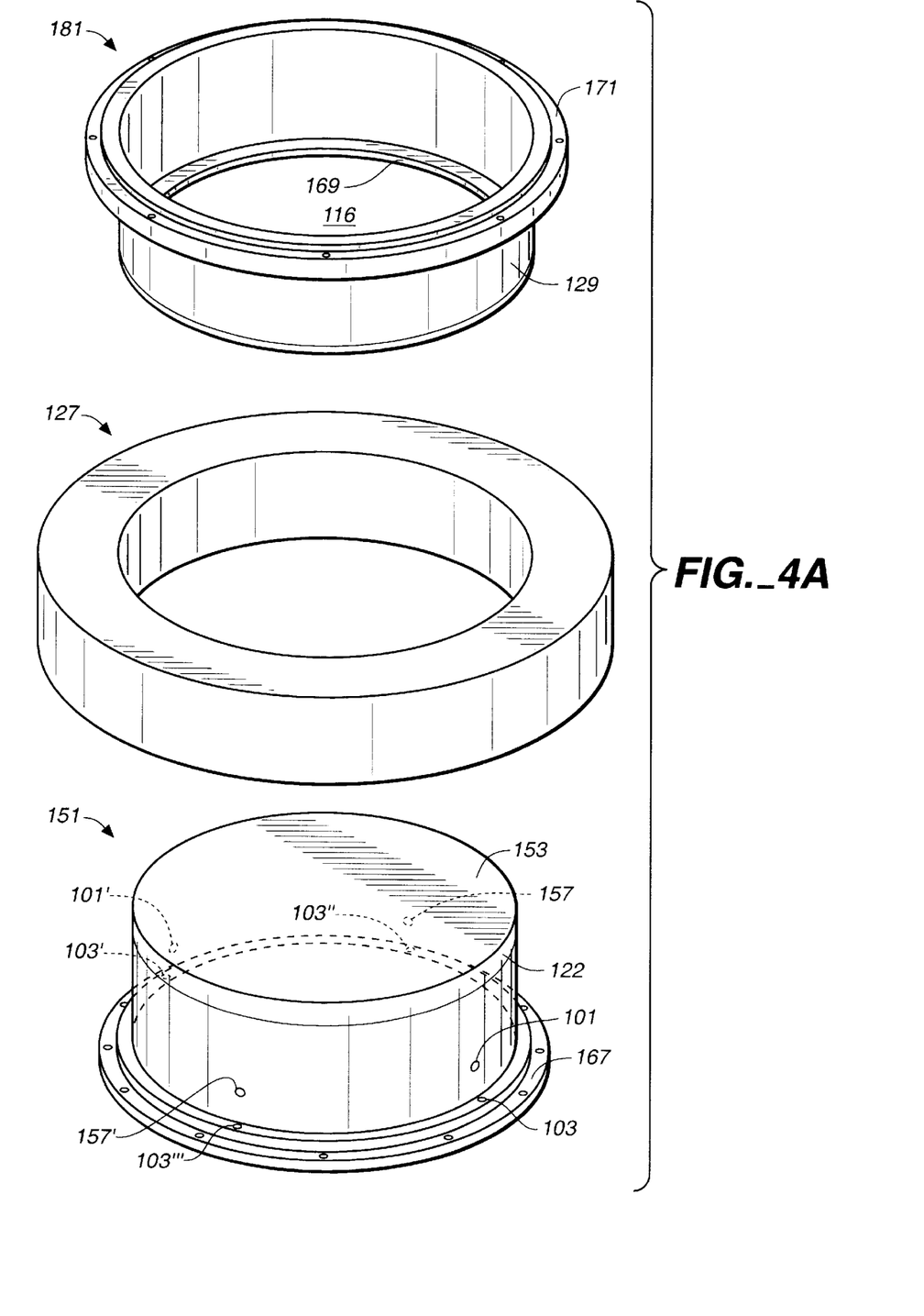
FIG. 4A is an exploded perspective view of the rotor system, stator, and central assembly according to an embodiment of the present invention.

FIG. 4A shows other components of the RTP system including rotor well 116 and central assembly 151. Also shown is a housing 181 which partially defines rotor well 116. Rotor well 116 is also generally defined by the base of chamber 100. Within rotor well 116 is central assembly 151 which includes reflector 153 and reflector cover 155 (shown in FIGS. 6–7 and 10).

Central assembly 151 also has mounted thereon a sensor system to detect the position of rotor 113 with respect to stator assembly 127. A feedback system, as described in more detail below, is used to provide small changes in power to the electromagnet coils of stator assembly 127 to keep rotor 113 rotating and in the general center of rotor well 116.

In particular, central assembly 151 includes one or more x-position sensors 101, 101', etc., one or more y-position sensors 157, 157', and one or more z-position sensors 103, 103', 103', 103'''. These sensors have sensor housings as detailed in FIG. 4B.

Figure 4B:
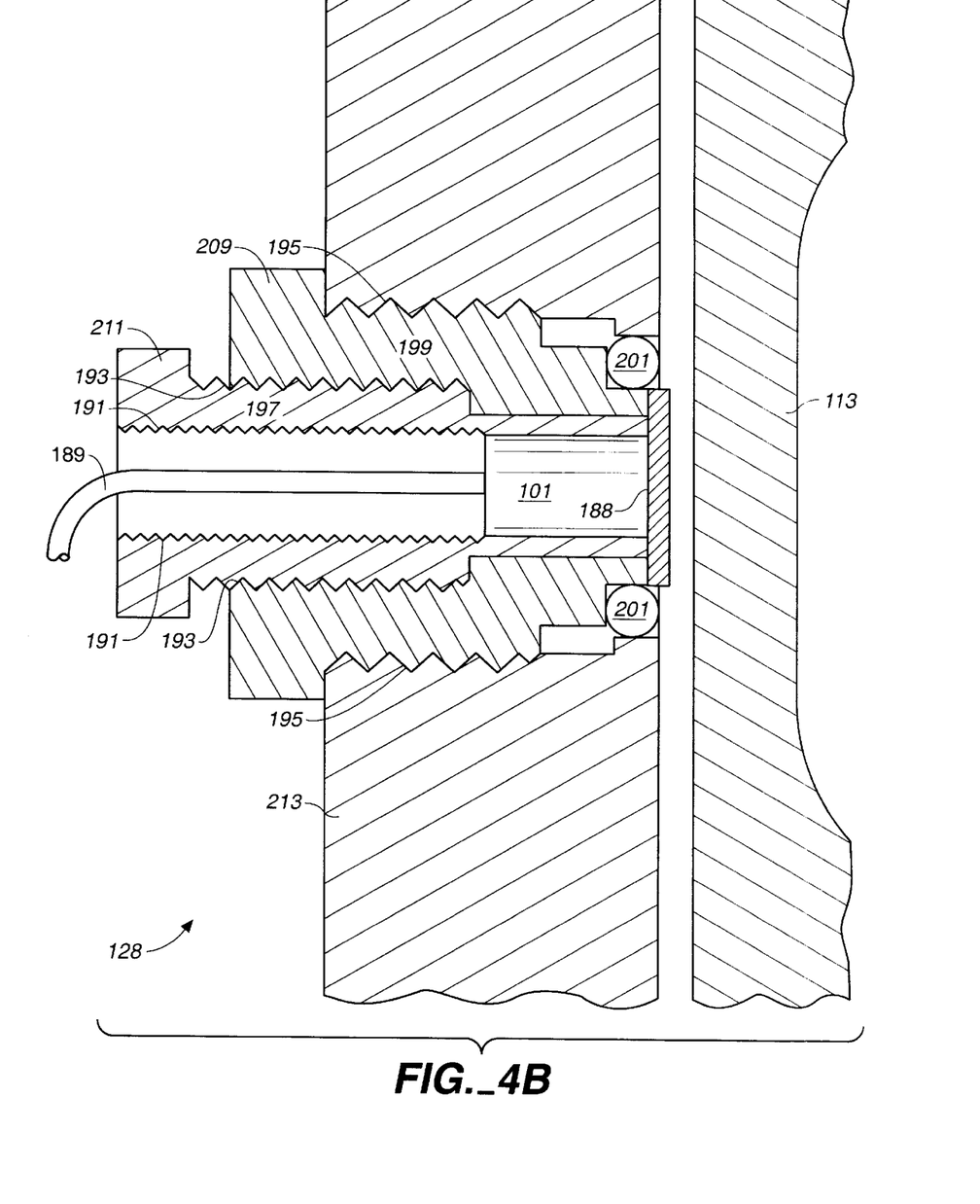
FIG. 4B is a side view of a sensor housing according to an embodiment of the present invention.

FIG. 4B shows a side view of x-sensor housing 128 but is generally applicable in describing the y- and z-sensors and sensor housings also. Sensor housing 128 is gas-tight so that process and purge gases do not contact and adversely affect the sensor inside. Sensor housing 128 is generally disposed within the wall of central assembly 151, and is structured and arranged such that the sensor within is facing the object to be measured (the rotor). In these figures, two x-position sensors and two y-position sensors are shown located around the circumference of central assembly 151 at the level of rotor 113. Four z-position sensors are located along the base of central assembly 151, these sensors facing upwards so as to measure the vertical position of rotor 113. The sensors measure the horizontal and vertical position of the rotor without penetrating the chamber or requiring the routing of wiring within the chamber.

Sensor 101 is shown generally in the center of sensor housing 128 and is oriented so that it faces rotor 113. Sensor 101 may be of a capacitive type to measure the rotor position by sensing the same through a sensor cover 188 which is held in place by an O-ring 201. In particular, capacitive sensors sense the capacitance between a metal electrode within the sensor and the metallic rotor. By measuring the changes in this capacitance, changes in the rotor's distance from the sensors may be determined. Details of the sensor and accompanying electronics are not shown as these are well within the ambit of one skilled in the art. Cover 188 may have a thickness in a range of about 10 mils to about 30 mils, and particularly may be about 20 mils thick. In general, sensor 101 should be within about 60 mils of rotor 113 in order to effectively sense the rotor's position. Sensor 101 communicates its measurements of rotor position via cable 189. Cable 189 connects to a plug 211 whose structure is described in more detail below.

Cover 188 may be constructed of a process-compatible, non-conductive material (e.g., a polyamide-imide such as Torlon or Vespel). By making cover 188 of such materials, cover 188 may also serve as a touchdown seat. That is, when rotor 113 is brought to rest, it generally clings to one wall of central assembly 151 because of the permanent magnets in stator 127. In the case where rotor 113 comes to rest on cover 188, rotor 113 will not directly contact central assembly 151. This may be important because, as both components are metal, direct contact often releases metal particulates and dust.

A threading scheme is used to allow positional adjustment of sensor 101. a double set of threads are used so that position adjustments may be made without inconveniently rotating cable 189 about its long axis and causing undesired tangles. A set of sensor threads 191 thread sensor 101 into a sensor adjustor 197. A first plug 211 prevents over-rotation of adjustor 197 into a sensor mount 199. Sensor threads 191 may have a fine pitch such as in a range of about 20 to 32 threads per inch. a set of adjustor threads 193 thread sensor adjustor 197 into sensor mount 199. A second plug 209 prevents over-rotation of sensor mount 199 into central assembly 151. Adjustor threads 193 may have a coarser pitch such as in a range of about 12 to 18 threads per inch. Sensor mount 199 threads into wall 213 of central assembly 151 via sensor mount threads 195. The above double-threading system allows the sensor to be translated along its longitudinal axis without over-rotating the sensor itself, this over-rotation associated with twisted sensor cords.

Figure 5:
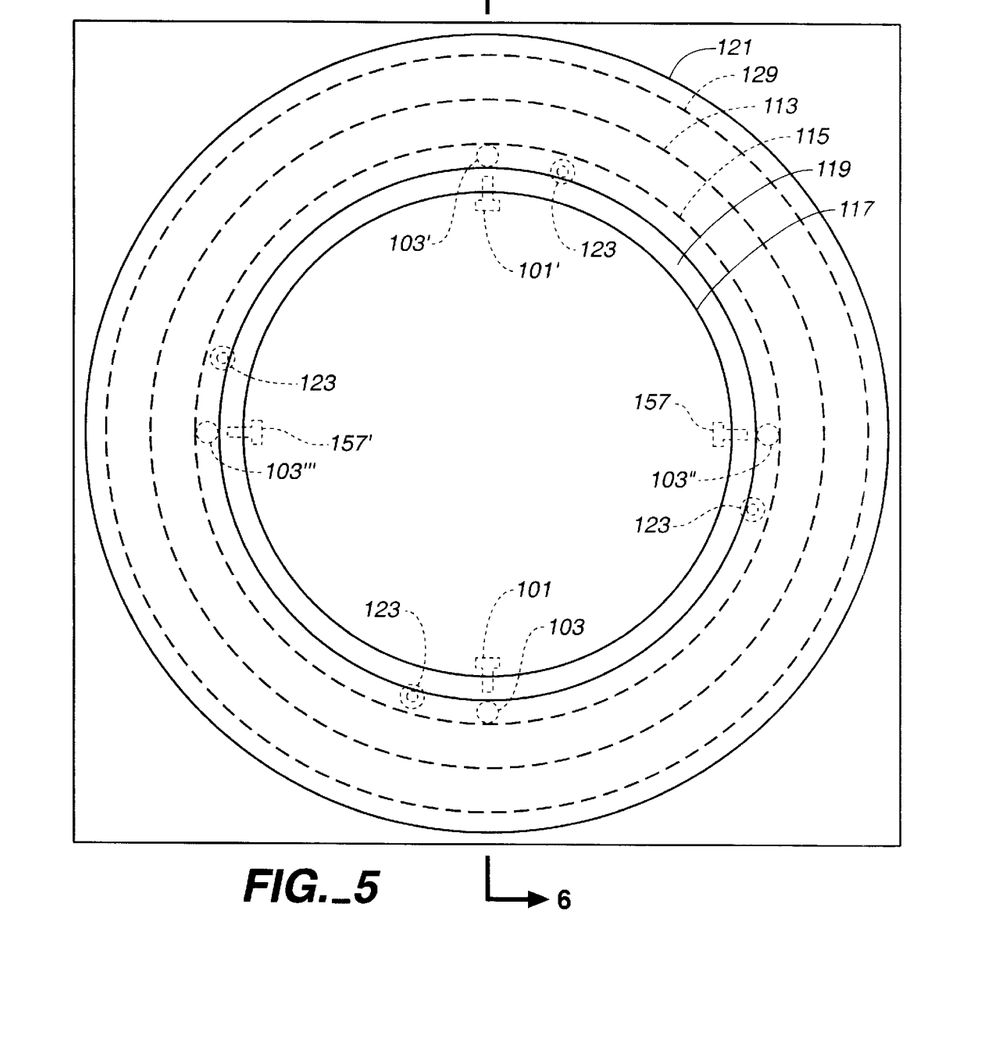
FIG. 5 is a top plan view of the rotor system according to an embodiment of the present invention.

One sensor layout that has been found to provide acceptable results has two x-position sensors diametrically opposed, two y-position sensors diametrically opposed, and four z-position sensors located 90° apart around the base of rotor well 116. A plan view of such a system is shown in FIG. 5. In this figure, the two x-position sensors 101 and 101' are shown at right angles to the two y-position sensors 157 and 157'. The four z-position sensors 103, 103', 103" and 103'" are shown located circumferentially around the base of rotor 113. The radial distance of z-position sensors 103 from the center of rotor well 116 may be just greater than the inside radius of rotor 113. However, as shown in FIG. 3, rotor 113 may have lobes 186 which reduce the weight of rotor 113. The radial distance of z-position sensors 103 from the center of rotor well 116 may be advantageously such that sensors 103 do not view the cut-out area between lobes 186. Otherwise, sensors 103 may give spurious readings.

Figure 6:
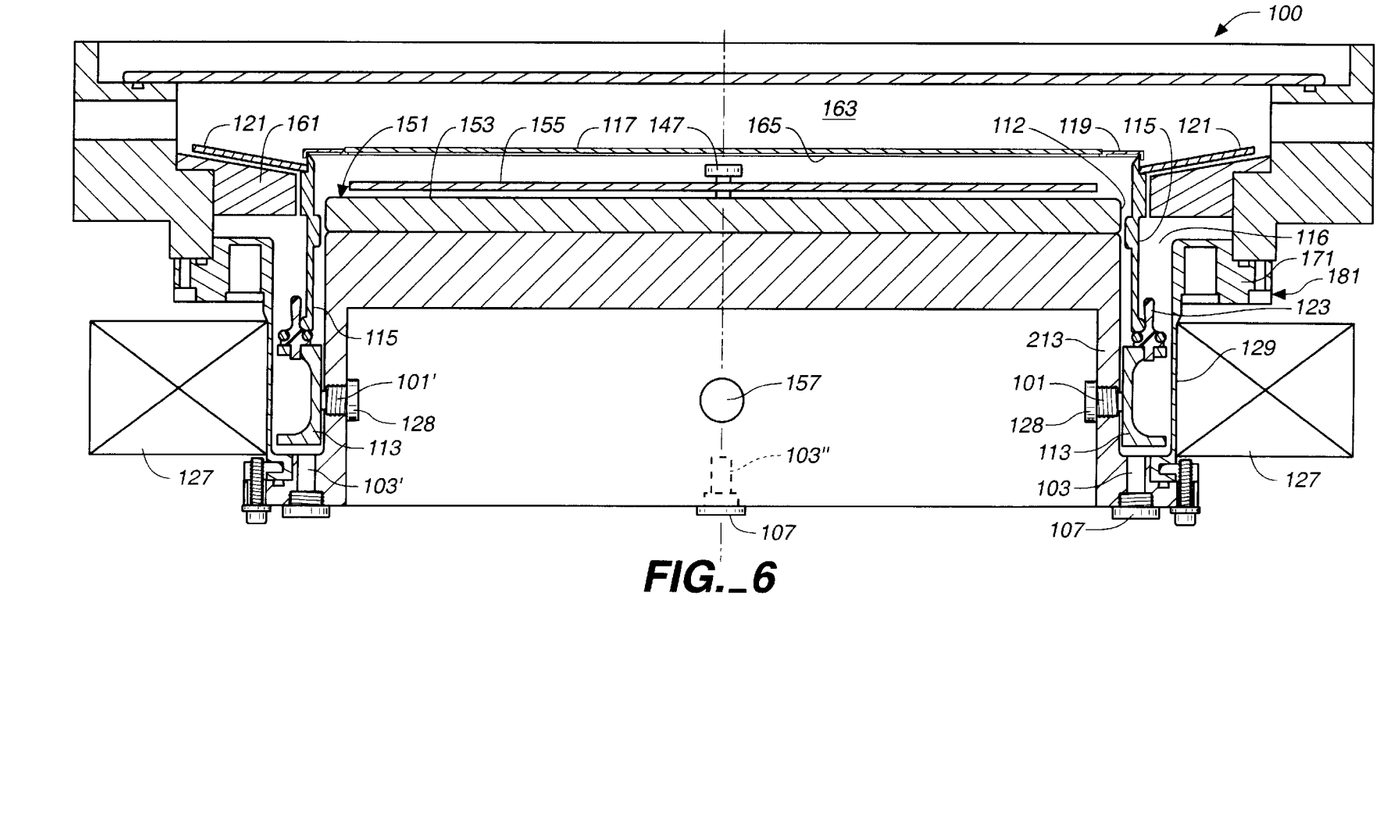
FIG. 6 is a cross-sectional view of the rotor system of the present invention taken generally along line 6—6 of FIG. 5, showing details of the magnetic levitation system. This view is taken with the rotor in a rest position and touching the sensor windows.

The overall system described above is provided in a cross-sectional view in FIG. 6.

Figure 7:
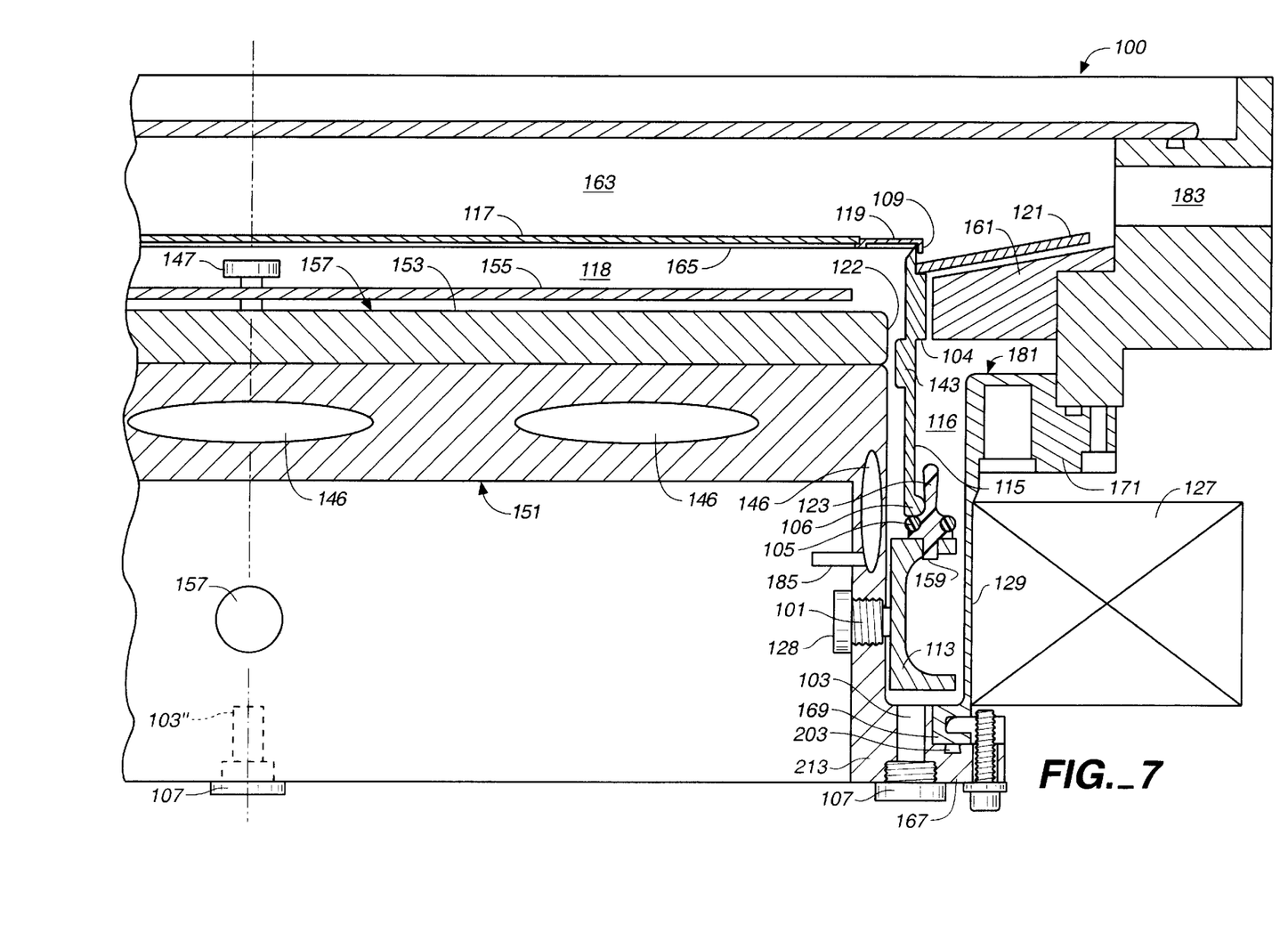
FIG. 7 is an enlarged view of a portion of FIG. 6.

Referring to the expanded cross-sectional view of FIG. 7, central assembly 151 has, near its base, an assembly abutment 167 which is generally a relatively thick mounting section. Similarly, cylindrical thin wall 129 has a cavity abutment 169 which is also generally a relatively thick mounting section. Cavity abutment 169 is mounted to assembly abutment 167 to provide a sealed vacuum-tight base for chamber 100. This mounting arrangement may be accomplished by a series of bolts 203, although clamps or other mounting techniques known to those skilled in the art may also be used.

When central assembly 151 is to be removed from rotor well 116, for example, for maintenance, assembly abutment 167 is unmounted from cavity abutment 169. Central assembly 151 may then be removed. As all of the sensors are mounted to central assembly 151, their relative positions are not disturbed by the removal of central assembly 151 from rotor well 116. Therefore, there is no need to recalibrate the sensors as there would be if the relative sensor positions were altered upon removal of the central assembly. In some prior systems, some of the sensors were mounted on a section of the chamber integral with the cavity abutment, and other sensors were mounted on a section of the chamber integral with the assembly abutment. When the central assembly was removed from the chamber, the sensors required recalibration. This advantage of eliminating the need for recalibration is one of the advantages of the invention.

Rotor well 116 may be made wide enough so that, upon removal of rotor system 111, hand-cleaning is possible. That is, the clearance between cylindrical thin wall 129 and support cylinder 115 may be such that a cleaning tool may be inserted to remove particulates and residues.

The circulation circuit and chambers 146 also extract heat from cylindrical thin wall 129, stator assembly 127, and rotor 113. In particular, heat may be removed from these components by radiation to chambers 146. This is especially important with respect to rotor 113 because, as rotor 113 is levitated, it is difficult to cool through conventional methods. A purge gas may be provided, as discussed below, to enhance conduction of heat from rotor 113 to chambers 146.

Figure 8A:
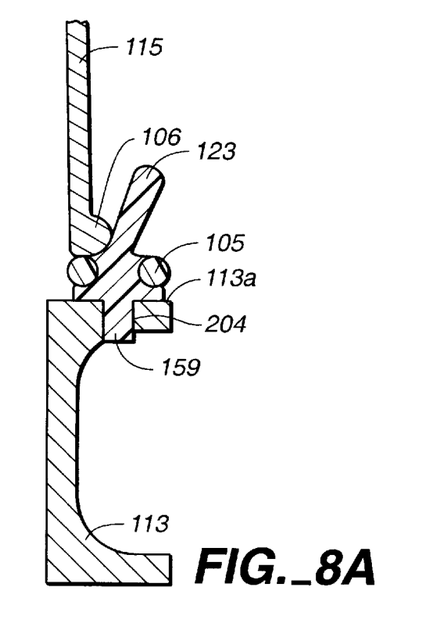
FIGS. 8A and 8B show locator pin positions upon rotor expansion.
Figure 8B:
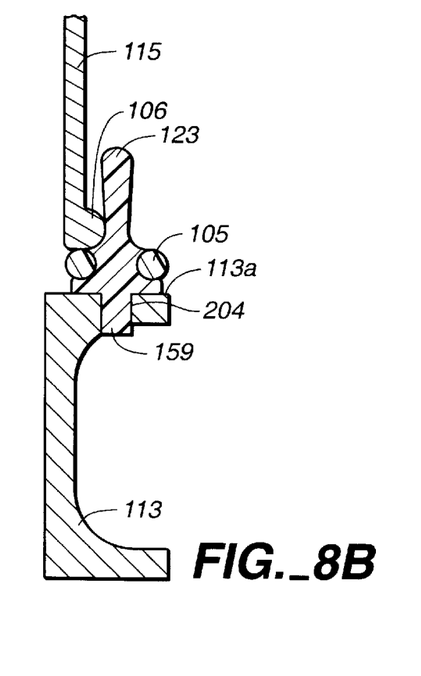

As shown in FIGS. 7, and 8A–8B, third flange 106 of support cylinder 115 frictionally engages a plurality of flexible locator pins 123 (see also FIG. 5) that are friction-fit mounted in a plurality of holes 204 in an upper periphery surface 113a of rotor 113. Locator pins 123 may be made of, for example, Teflon (PTFE) or Vespel. One design that has been found acceptable uses four locator pins 123. Each locator pin 123 has a locator pin O-ring 105 encircling it, generally at its narrowest portion. O-ring 105 strengthens and stiffens locator pin 123 against overly large deflections. Each locator pin 123 is secured by a pin plug 159, an equal number of which are disposed generally equidistantly around top surface 113a of rotor 113. Pin plug 159 is friction-fit inserted in a non-threaded manner into a corresponding hole in the top surface of rotor 113.

By the engagement of third flange 106 with locator pins 123, support cylinder 115 is supported on rotor 113 in a secure but flexible manner. The plurality of holes 204 in surface 113a forms a circle whose radius is generally larger than the radius of support cylinder 115. Rotation of rotor 113 results in a corresponding rotation of support cylinder 115. The friction-fit of third flange 106 by means of locator pins 123 is tight enough that support cylinder 115 does not slip or skip on locator pins 123 as rotor 113 is brought up to operating speed.

The use of locator pins 123 ensures that support cylinder 115 does not rotate in an eccentric manner during processing. As noted before, rotor 113 is heated during processing. Thus, it expands and its diameter increases. The locator pins 123, which are flexible, allow for this expansion.

FIG. 8A shows support cylinder 115 resting on locator pin O-ring 105 when rotor 113 is cool. Locator pin 123 may be bent at an angle so that the face with which it contacts third flange 106 is almost vertical. During processing, as the diameter of rotor 113 increases, the angle at which locator pin 123 is bent decreases until locator pin 123 is nearly vertical. This is the situation shown in FIG. 8B. Despite the decreased angle, locator pin 123 may still contact third flange 106 and hold support cylinder 115 in a firm manner to rotor 113. The distance over which locator pin 123 may move as rotor 113 heats may be about 20 to 30 mils.

It is additionally noted that the friction-fit of locator pins 123 via pin plugs 159 is tight enough that locator pins 123 do not inadvertently disengage from holes 204 in rotor 113, even at high rotational speeds and even despite the fact that they are installed without threading. By avoiding threading, holes 204 do not contribute a large amount of surface area over which gases may adsorb to contaminate the chamber. Also, in cases where rotor 113 has a coating, the coating more easily coats an unthreaded hole than a threaded one. Finally, locator pins 123 tend to reduce the production of metallic particles due to relative motion and friction between support cylinder 115 and rotor 113.

Figure 9:
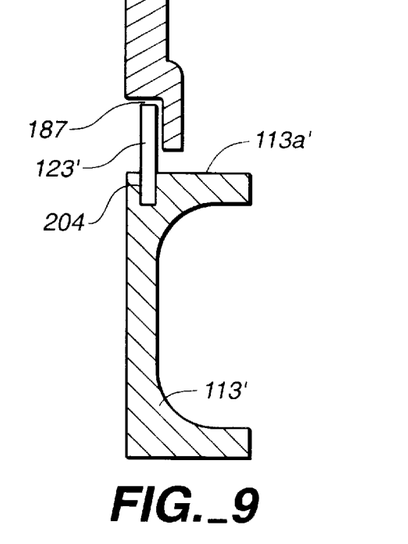
FIG. 9 is a cross-section view of another embodiment of the locator pins.

In another embodiment, as shown in FIG. 9, a support cylinder 115' is coupled to a rotor 113' in another manner. Here, support cylinder 115' has a circular groove 187 around its bottom perimeter. A plurality of locator pins 123' emerge from friction-fit mountings in rotor upper surface 113a' and engage groove 187 at a number of different locations. Locator pins 123' may have the shape of bats similar to locator pins 123. This embodiment has the advantage of an even narrower gas flow path between cavity 118 and rotor system 111 (shown by arrow 175 in FIG. 10 and described below). Moreover, as a large amount of surface area of support cylinder 115 is close to water chambers 146 in this embodiment, a significant amount of heat can be extracted from support cylinder 115.

Referring back to FIG. 7, first flange 104 is used as a support for co-rotating edge ring extension 121. Co-rotating edge ring extension 121 has a generally frustal shape, and extends radially outwards from first flange 104 towards the side of chamber 100. The frictional fit of co-rotating edge ring extension 121 on first flange 104 ensures that co-rotating edge ring extension 121 will rotate with support cylinder 115 without skipping or slipping.

The clearance between co-rotating edge ring extension 121 and a bearing cover 161 below it is small, and may be in the range of about 30 to 90 mils. By means of this small clearance, the amount of process gases which can flow from processing region 163 down to rotor system 111 and its accompanying components is minimized. In the same way, co-rotating edge ring extension 121 also serves to thermally isolate the components within rotor well 116 from the heat generated in processing region 163.

Co-rotating edge ring extension 121 may be made of quartz or other materials such as graphite, silicon carbide, ceramic, etc. By constructing co-rotating edge ring extension 121 of such materials, it may not absorb a large amount of the radiant energy of the lamps. This may be important because such absorption may heat co-rotating edge ring extension 121 which would increase vaporization of hot reactive species from its surface back into process region 163. Of course, according to the demands of the process, it may be desirable to have the lamps heat co-rotating edge ring extension 121. In this case, co-rotating edge ring extension 121 may be made out of, e.g., graphite. More details of the co-rotating edge ring extension may be found in U.S. patent application Ser. No. 08/880,194 entitled "Co-Rotating Edge Ring Extension for Use in a Semiconductor Processing Chamber", filed on even date, May 16, 1997 assigned to the assignee of the present invention, and incorporated herein by reference.

In another feature, the thickness of flanges 104, 106 and 143 provides a degree of stiffness to support cylinder 115 in order to prevent out-of-round distortions. In particular, and as mentioned above, support cylinder 115 may be primarily constituted of a thin quartz material and may be subjected to deleterious process conditions and high rotational speeds. To avoid distortions of support cylinder 115, it is advantageous to provide the same with areas of enhanced strength and stiffness. The thickness of the flange sections (104, 143 and 106) assists in providing this significant degree of strength.

As mentioned above, and as shown particularly in FIG. 7, second flange 143 projects from between support cylinder 115 toward reflector sidewall 122 of central assembly 151. In so doing, second flange 143 accomplishes a number of objectives. First, it restricts gases which may be present near underside 165 of substrate 117 from flowing down to rotor 113 and its accompanying components. Second, as noted, flange 143 stiffens support cylinder 115 to provide more strength which is particularly important during high speed rotations. Third, flange blocks undesirable light emanating from processing region 163 that may otherwise radiate down to sensors 101, 101', 103–103''', and 157 and 157'. Fourth, the small clearance between second flange 143 and reflector sidewall 122 allows some heat from support cylinder 115 to be conducted away to reflector sidewall 122. This heat is then removed by the circulation circuit in central assembly 151.

As noted above, one cylindrical portion of rotor well 116 is bounded by cylindrical thin wall 129. The thickness of cylindrical thin wall 129 may be less than a millimeter. The top periphery of cylindrical thin wall 129 is connected to a thin wall flange 171. The bottom of cylindrical thin wall 129 is provided by cavity abutment 169. Thin wall flange 171, cylindrical thin wall 129 and cavity abutment 169 may be advantageously constructed from a single piece of stainless steel, referred to here as housing 181. While cylindrical thin wall 129 is shown as a vertical wall, other angles may also be used. However, a vertical design may be preferred to prevent distortion or collapse of cylindrical thin wall 129. A vertical design may also be simpler to manufacture.

Cylindrical thin wall 129 provides a boundary between rotor 113 and stator assembly 127. In particular, for rotor 113 to be magnetically levitated by stator assembly 127, rotor 113 must be physically close to stator assembly 127 in order for efficient magnetic communication to occur (because of the inverse-square nature of electromagnetic fields). The total distance between stator assembly 127, which generates the magnetic field, and rotor 113 may be limited by the strength of the magnets to less than about 2.5 mm. The use of cylindrical thin wall 129 allows rotor 113 to be located close enough to stator assembly 127 to be effectively levitated by the magnetic fields created by stator assembly 127.

While rotor 113 must be reasonably close to stator assembly 127, clearance must also be available for thermal expansion of rotor 113 and to account for positioning error of the control system. When substrate 117 is heated by lamps 110, central assembly 151 and rotor system 111 also receive heat due to conduction and radiation. This heating causes a small thermal expansion of rotor 113. If rotor 113 is placed too close to cylindrical thin wall 129, the thermal expansion may cause rotor 113 to strike cylindrical thin wall 129 during rotation, resulting in potential damage to substrate 117, rotor system 111 and cylindrical thin wall 129. As both rotor system 111 and cylindrical thin wall 129 are highly sensitive and precisely machined components (as noted above, cylindrical thin wall 129 may be less than a millimeter thick), such collisions may result in very costly repairs. Moreover, such collisions may cause a substantial amount of metal dust contamination in the chamber.

Thus, the clearance between cylindrical thin wall 129 and rotor 113 is another important feature of the invention. One clearance that has been found to produce satisfactory results, in a system with a 300 mm substrate, is about 0.040 to 0.060 inches, and more particularly about 0.045 inches. These dimensions are based on a rotor diameter of about 13.5 inches but other diameter rotors may also be accommodated. Thus, if the clearance used is 0.045 inches, the inside diameter of cylindrical thin wall 129 would be about 13.590 inches. Such clearances are capable of accommodating a 100° C. rise in rotor temperature, as may be encountered in a system where the rotor temperature rises from 20° C. to 120° C. over the course of a process.

As shown in FIG. 7, a purge gas may be introduced into cavity 118 through a purge gas inlet or injector 147. Purge gas inlet 147 is connected to a gas supply (not shown). Additional details regarding the purge gas system may be found in U.S. patent application Ser. No. 08/687,166 now U.S. Patent No. for a "Method and Apparatus for Purging the Back Side of a Substrate During Chemical Vapor Processing", filed Jul. 24, 1996, and U.S. Pat. No. 5,960,555, entitled "Method and Apparatus for Purging the Back Side of a Substrate During Chemical Vapor Processing" both assigned to the assignee of the present application and incorporated herein by reference.

Figure 10:
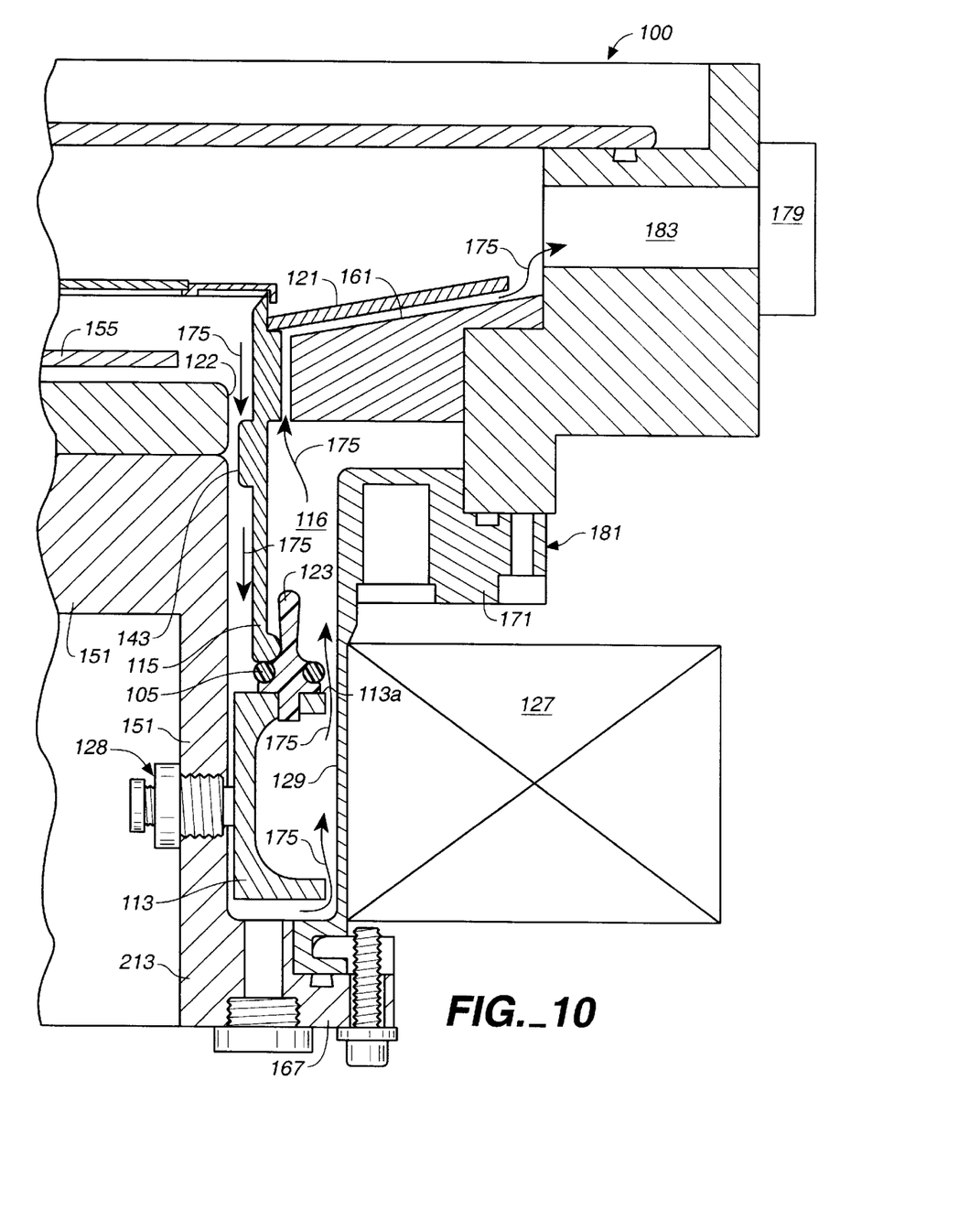
FIG. 10 is another enlarged view of a portion of FIG. 7, showing gas flow directions.

The purge gas may be flowed into cavity 118. Referring to FIG. 10, the purge gas path is shown by first gas path arrow 175. This purge gas flows downward between reflector sidewall 122 and support cylinder 115. The purge gas then flows down towards central assembly 151 and rotor 113. The purge gas then flows around rotor 113 and up adjacent cylindrical thin wall 129. The gas then flows between bearing cover 161 and co-rotating edge ring extension 121. In so doing, the purge gas is viscously pulled along co-rotating edge ring extension 121. The high rotational speed of co-rotating edge ring extension 121 assists in this effect. The purge gas then enters a gas exhaust port 183 and is removed by pumping system 179. In the case where some of the purge gas leaks from cavity 118 to processing region 163 due to, e.g., imperfections in edge ring 119, these gases may also be pulled along co-rotating edge ring extension 121 and removed.

This purge gas ensures that a continuous back-pressure is maintained so that deposition does not occur on backside 165 of substrate 117. A suitable back-pressure may be about 100 milliTorr, although this pressure varies according to the process.

The present invention has been described in terms of preferred embodiments. The invention, however, is not limited to the embodiment depicted and described. Rather, the scope of the invention is defined by the appended claims.

What is claimed is:

1. A magnetically levitated rotating system, comprising:
   a magnetically permeable rotor having a top surface including a plurality of holes;
   a plurality of locator pins in said plurality of holes;
   a support cylinder coupled to said rotor by said locator pins; and
   a magnetic stator assembly radially spaced from said support cylinder and said magnetically permeable rotor, wherein a magnetic field created by said stator assembly magnetically levitates said rotor.

2. The system of claim 1, further including a cylindrical thin wall concentric with and surrounding said rotor wherein a radial distance between said rotor and said cylindrical thin wall is between about 0.04 and 0.06 inches.

3. The system of claim 2 wherein a thickness of said cylindrical thin wall is between about 50 and 150 mils.

4. The system of claim 1, wherein said cylindrical thin wall is a wall of a semiconductor processing chamber.

5. The system of claim 1, wherein said locator pins are friction-fit mounted in a non-threaded manner in said plurality of holes.

6. The system of claim 1, wherein said holes are arranged in a circle having a radius greater than the radius of said support cylinder.

7. The system of claim 5, wherein said locator pins include a plurality of locator pin plugs, said locator pin plugs being friction-fit mounted in said plurality of holes.

8. The system of claim 1, wherein the support cylinder includes a flange for engaging the locator pins.

9. The system of claim 1, wherein the locator pins each include a ring to impart strength and stiffness.

10. The system of claim 8, wherein the locator pins are bent to engage the flange.

11. The system of claim 1, wherein the support cylinder includes a circular groove for engaging the locator pins.

* * * * *